(12) United States Patent
Pisek

(10) Patent No.: US 8,910,025 B2
(45) Date of Patent: Dec. 9, 2014

(54) METHOD AND APPARATUS OF QC-LDPC CONVOLUTIONAL CODING AND LOW-POWER HIGH THROUGHPUT QC-LDPC CONVOLUTIONAL ENCODER AND DECODER

(71) Applicant: Samsung Electronics Co., Ltd., Suwon-si, Gyeonggi-do (KR)

(72) Inventor: Eran Pisek, Plano, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/625,656

(22) Filed: Sep. 24, 2012

(65) Prior Publication Data

US 2013/0086455 A1   Apr. 4, 2013

Related U.S. Application Data

(60) Provisional application No. 61/542,655, filed on Oct. 3, 2011, provisional application No. 61/595,534, filed on Feb. 6, 2012.

(51) Int. Cl.
*H03M 13/00* (2006.01)
*H03M 13/11* (2006.01)

(52) U.S. Cl.
CPC ...... *H03M 13/1154* (2013.01); *H03M 13/6502* (2013.01); *H03M 13/116* (2013.01)
USPC ........................................................ 714/776

(58) Field of Classification Search
CPC ... H04L 1/0057; H04L 1/0061; H04L 1/0041; H04L 1/0083; H04L 1/0072
USPC .......................................................... 714/776
See application file for complete search history.

(56) References Cited

U.S. PATENT DOCUMENTS

| | | | |
|---|---|---|---|
| 8,151,031 B2 * | 4/2012 | Biscondi et al. | 711/5 |
| 8,201,059 B2 * | 6/2012 | Oh et al. | 714/781 |
| 8,484,547 B2 * | 7/2013 | Jakka et al. | 714/810 |
| 2007/0033480 A1 | 2/2007 | Lee et al. | |
| 2007/0079223 A1* | 4/2007 | Mondin et al. | 714/780 |
| 2009/0089642 A1 | 4/2009 | Miles et al. | |

(Continued)

FOREIGN PATENT DOCUMENTS

| | | | |
|---|---|---|---|
| EP | 917295 A2 * | 5/1999 | |
| EP | 1901433 A1 | 3/2008 | |

OTHER PUBLICATIONS

International Search Report dated Mar. 8, 2013 in conncection with International Application No. PCT/KR2012/008030, 3 pages.

(Continued)

*Primary Examiner* — Albert Decady
*Assistant Examiner* — Enam Ahmed

(57) ABSTRACT

A low-density parity check (LDPC) encoder and input configured to receive an incoming signal stream. The encoder generates, from a block code H-matrix comprising a data portion and a parity check portion, a continuous H-matrix by concatenating the data portion into successive, recurring, data blocks that are separated by a specified symbol interval, and performs LDPC encoding of each data portion using the parity check portion associated with the data portion using its associated parity check portion. Additionally, a Trellis-based low-density parity check (LDPC) decoder configured to receive an encoded stream and decode the received signal to recover the signal stream.

20 Claims, 15 Drawing Sheets

(56) References Cited

U.S. PATENT DOCUMENTS

| | | |
|---|---|---|
| 2010/0023838 A1 | 1/2010 | Shen et al. |
| 2011/0029835 A1 | 2/2011 | Li et al. |
| 2011/0029845 A1* | 2/2011 | Zhou et al. ................. 714/776 |
| 2011/0138258 A1* | 6/2011 | Okamura et al. ............. 714/780 |
| 2012/0272113 A1* | 10/2012 | Levita ........................... 714/748 |
| 2012/0304035 A1* | 11/2012 | Murakami et al. ............ 714/752 |

OTHER PUBLICATIONS

Written Opinion of the International Searching Authority dated Mar. 8, 2013 in connection with International Application No. PCT/KR2012/008030, 5 pages.

* cited by examiner

| | $H_{sys}(i,k)$ 302 | | | | | | | | $H_{par}(i,k)$ 304 | | | | | | | |
|---|---|---|---|---|---|---|---|---|---|---|---|---|---|---|---|---|
| | 0 | 1 | 2 | 3 | 4 | 5 | 6 | 7 | 0 | 1 | 2 | 3 | 4 | 5 | 6 | 7 |
| 0 | 40 | -1 | 38 | -1 | 13 | -1 | 5 | -1 | 18 | -1 | -1 | -1 | -1 | -1 | -1 | -1 |
| 1 | 34 | -1 | 35 | -1 | 27 | -1 | -1 | 30 | 2 | 1 | -1 | -1 | -1 | -1 | -1 | -1 |
| 2 | -1 | 36 | -1 | 31 | -1 | 7 | -1 | 34 | -1 | 10 | 41 | -1 | -1 | -1 | -1 | -1 |
| 3 | -1 | 27 | -1 | 18 | -1 | 12 | 20 | -1 | -1 | -1 | 15 | 6 | -1 | -1 | -1 | -1 |
| 4 | 35 | -1 | 41 | -1 | 40 | -1 | 39 | 4 | 28 | -1 | -1 | 3 | 28 | -1 | -1 | -1 |
| 5 | 29 | -1 | 0 | -1 | -1 | 22 | -1 | 20 | -1 | 28 | -1 | 27 | -1 | 23 | -1 | -1 |
| 6 | -1 | 31 | -1 | 23 | -1 | 21 | 14 | -1 | -1 | -1 | 12 | -1 | -1 | 0 | 13 | -1 |
| 7 | -1 | 22 | -1 | 34 | 31 | -1 | -1 | -1 | 4 | -1 | -1 | -1 | 13 | -1 | 22 | 24 |

FROM FIG. 12A

| | | | | | | | $I(Z_{14})$ | $I(Z_{15})$ |
|---|---|---|---|---|---|---|---|---|
| | | | | | $I(Z_{12})$ | $I(Z_{13})$ | $I(Z_{14})$ | $I(Z_{15})$ |
| | | | $I(Z_{10})$ | $I(Z_{11})$ | $I(Z_{12})$ | $I(Z_{13})$ | $I(Z_{14})$ | $I(Z_{15})$ |
| T=7 | $I(Z_8)$ | $I(Z_9)$ | $I(Z_{10})$ | $I(Z_{11})$ | $I(Z_{12})$ | $I(Z_{13})$ | $I'(Z_{14})$ | $I'(Z_{15})$ |
| T=6 | $I(Z_8)$ | $I(Z_9)$ | $I(Z_{10})$ | $I(Z_{11})$ | $I'(Z_{12})$ | $I'(Z_{13})$ | $I(Z_6)$ | $I(Z_7)$ |
| T=5 | $I(Z_8)$ | $I(Z_9)$ | $I'(Z_{10})$ | $I'(Z_{11})$ | $I(Z_4)$ | $I(Z_5)$ | $I(Z_6)$ | $I(Z_7)$ |
| T=4 | $I'(Z_8)$ | $I'(Z_9)$ | $I(Z_2)$ | $I(Z_3)$ | $I(Z_4)$ | $I(Z_5)$ | $I(Z_6)$ | $I(Z_7)$ |
| T=3 | $I(Z_0)$ | $I(Z_1)$ | $I(Z_2)$ | $I(Z_3)$ | $I(Z_4)$ | $I(Z_5)$ | $I'(Z_6)$ | $I'(Z_7)$ |
| T=2 | $I(Z_0)$ | $I(Z_1)$ | $I(Z_2)$ | $I(Z_3)$ | $I'(Z_4)$ | $I'(Z_5)$ | $I(Z_{-2})$ | $I(Z_{-1})$ |
| T=1 | $I(Z_0)$ | $I(Z_1)$ | $I'(Z_2)$ | $I'(Z_3)$ | $I(Z_{-4})$ | $I(Z_{-3})$ | $I(Z_{-2})$ | $I(Z_{-1})$ |
| T=0 | $I'(Z_0)$ | $I'(Z_1)$ | $I(Z_{-6})$ | $I(Z_{-5})$ | $I(Z_{-4})$ | $I(Z_{-3})$ | $I(Z_{-2})$ | $I(Z_{-1})$ |
| T=-1 | $I(Z_{-8})$ | $I(Z_{-7})$ | $I(Z_{-6})$ | $I(Z_{-5})$ | $I(Z_{-4})$ | $I(Z_{-3})$ | $I'(Z_{-2})$ | $I'(Z_{-1})$ |

2Z/T BIT STREAM INPUT RATE

METHOD AND APPARATUS OF QC-LDPC CONVOLUTIONAL CODING AND LOW-POWER HIGH THROUGHPUT QC-LDPC CONVOLUTIONAL ENCODER AND DECODER

CROSS-REFERENCE TO RELATED APPLICATION(S) AND CLAIM OF PRIORITY

The present application is related to U.S. Provisional Patent Application No. 61/542,655, filed Oct. 3, 2011, entitled "LOW POWER MAXIMUM LIKELIHOOD LDPC CONVOLUTIONAL DECODER" and U.S. Provisional Patent Application No. 61/595,534, filed Feb. 6, 2012, entitled "LOW POWER MAXIMUM LIKELIHOOD LDPC CONVOLUTIONAL DECODER". The content of the above-identified patent documents is incorporated herein by reference.

TECHNICAL FIELD

The present application relates generally to encoding devices, and more particularly, to a method and apparatus of QC-LDPC convolutional coding and a low-power, high throughput QC-LDPC convolutional encoder and decoder.

BACKGROUND

Low density parity check (LDPC) codes are channel codes used in forward error correcting (FEC) schemes. LDPC codes are well known for their good performance. Moreover, their structure is suitable for parallel decoding, which makes them suitable for relatively fast decoding. The ability to provide fast decoding can be particularly useful for today's high speed communication networks that are currently being deployed. Consequently, many of the currently active telecommunication standards have LDPC codes in their physical layer FEC scheme, such as the Institute of Electrical and Electronics Engineers (IEEE) 802.16e standard, IEEE 802.15c standard, and Digital Video Broadcasting-Satellite-Second Generation (DVB-S2) standard.

SUMMARY

According to certain embodiments, a low-density parity check (LDPC) decoder and input configured to receive an encoded signal stream including a plurality of successive, recurring data blocks using of a plurality of associated parity check portions. The data blocks and their associated parity check portions comprising a continuous H-matrix generated from a block code H-matrix by concatenating a data portion of the block code H-matrix into the data blocks that are separated by a specified symbol interval.

According to certain embodiments, a low-density parity check (LDPC) decoding method includes receiving an encoded signal stream and performing LDPC decoding of the encoded signal stream including a plurality of successive, recurring data blocks using of a plurality of associated parity check portions. The data blocks and their associated parity check portions including a continuous H-matrix that is generated from a block code H-matrix by concatenating a data portion of the block code H-matrix into the data blocks that are separated by a specified symbol interval.

According to certain embodiments, a low-density parity check (LDPC) encoder and input configured to receive an incoming signal stream. The encoder generates, from a block code H-matrix comprising a data portion and a parity check portion, a continuous H-matrix by concatenating the data portion into successive, recurring, data blocks that are separated by a specified symbol interval, and performs LDPC encoding of each data portion using the parity check portion associated with the data portion using its associated parity check portion.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, where such a device may be implemented in hardware that is programmable by firmware or software. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 3 illustrates a parity check H-matrix associated with an LDPC encoding scheme according to embodiments of the present disclosure;

FIGS. 10A and 10B illustrate an example QC-LDPC convolutional encoder according to certain embodiments of the present disclosure;

FIGS. 11A and 11B illustrate an example encoding process that can be performed by certain embodiments of the QC-LDPC convolutional encoder of FIGS. 10A and 10B;

FIGS. 12A, 12B and 12C illustrate an example scheduling order that can be performed by certain embodiments of the stream buffering and XOR block of FIGS. 10A and 10B.

DETAILED DESCRIPTION

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure can be implemented in any suitably arranged wireless or wireline communication system.

Figure 1:
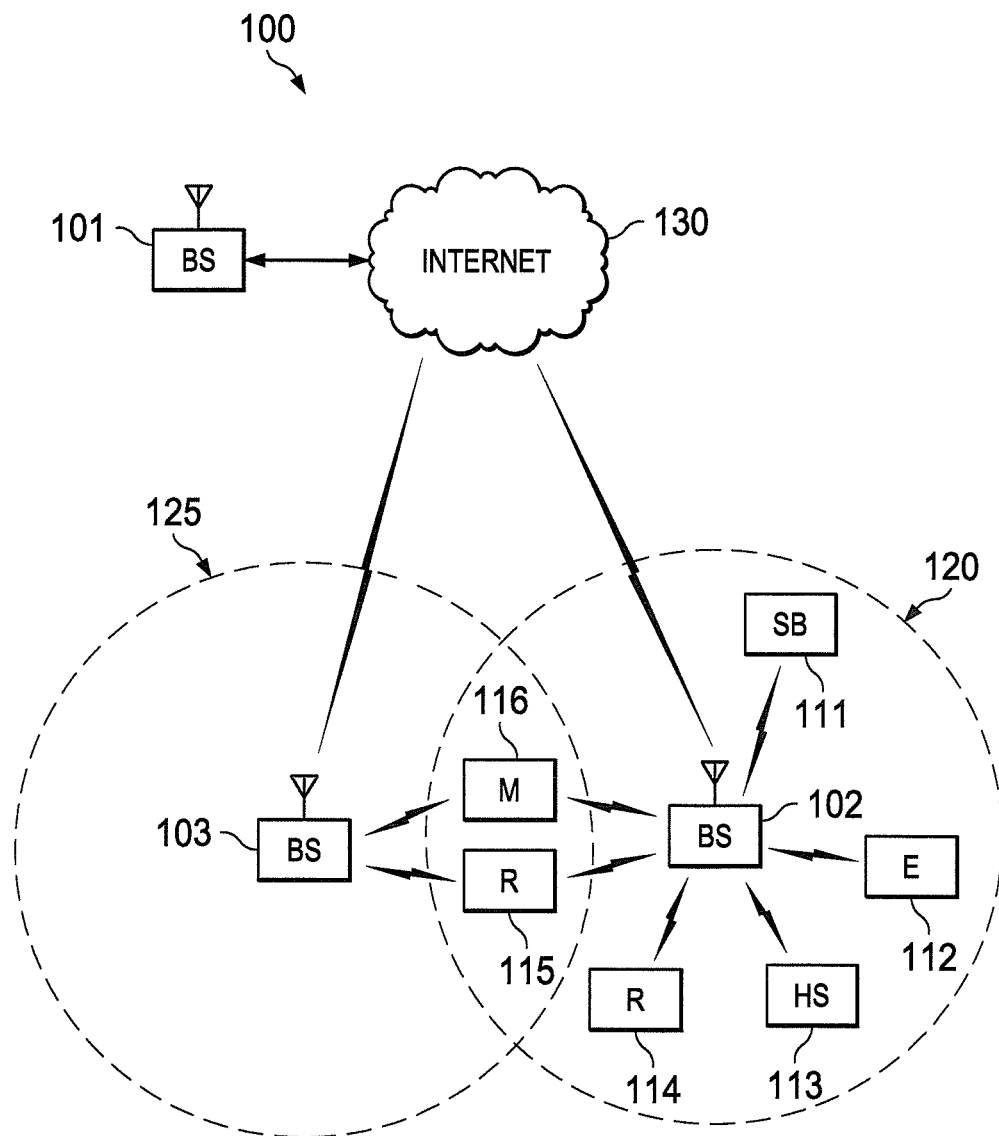
FIG. 1 illustrates a wireless network that performs LDPC encoding and decoding according to the embodiments of the present disclosure.

FIG. 1 illustrates a wireless network 100 that performs an LDPC encoding and decoding process according to the embodiments of the present disclosure. The embodiment of the wireless network 100 shown in FIG. 1 is for illustration only. Other embodiments could be used without departing from the scope of this disclosure.

The wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of mobile stations within coverage area 120 of base station 102. The first plurality of mobile stations includes mobile station 111, which can be located in a small business (SB), mobile station 112, which can be located in an enterprise (E), mobile station 113, which can be located in a WiFi hotspot (HS), mobile station 114, which can be located in a first residence (R), mobile station 115, which can be located in a second residence (R), and mobile station 116, which can be a mobile device (M), such as a cell phone, a wireless laptop, a wireless PDA, or the like.

Base station 103 provides wireless broadband access (via base station 101) to Internet 130 to a second plurality of mobile stations within coverage area 125 of base station 103. The second plurality of mobile stations includes mobile station 115 and mobile station 116. In an exemplary embodiment, base stations 101-103 communicate with each other and with mobile stations 111-116 using OFDM or OFDMA techniques.

Base station 101 can be in communication with either a greater number or a lesser number of base stations. Furthermore, while only six mobile stations are depicted in FIG. 1, it is understood that wireless network 100 can provide wireless broadband access to additional mobile stations. It is noted that mobile station 115 and mobile station 116 are located on the edges of both coverage area 120 and coverage area 125. Mobile station 115 and mobile station 116 each communicate with both base station 102 and base station 103 and can be said to be operating in handoff mode, as known to those of skill in the art.

Mobile stations 111-116 access voice, data, video, video conferencing, and/or other broadband services via Internet 130. In an exemplary embodiment, one or more of mobile stations 111-116 is associated with an access point (AP) of a WiFi WLAN. Mobile station 116 can be any of a number of mobile devices, including a wireless-enabled laptop computer, personal data assistant, notebook, handheld device, or other wireless-enabled device. Mobile stations 114 and 115 can be, for example, a wireless-enabled personal computer (PC), a laptop computer, a gateway, or another device.

Figure 2A:
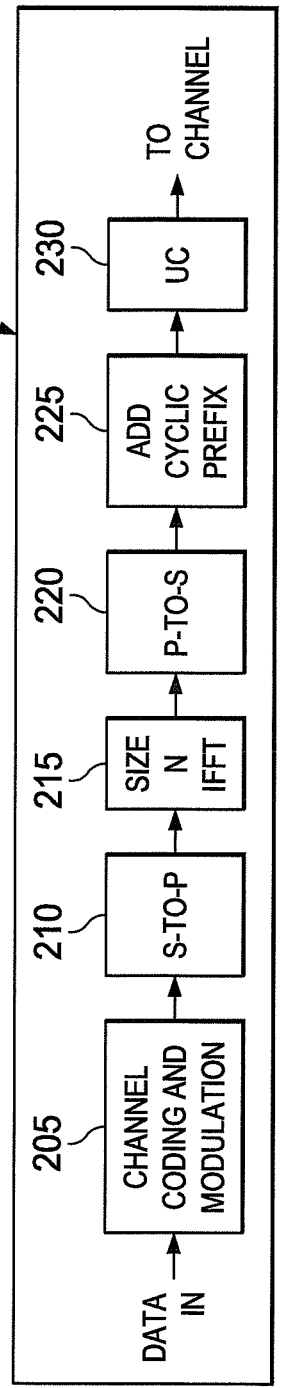
FIGS. 2A and 2B illustrate an orthogonal frequency division multiple access (OFDMA) transmit path and receive path, respectively, according to embodiments of the present disclosure.
Figure 2B:
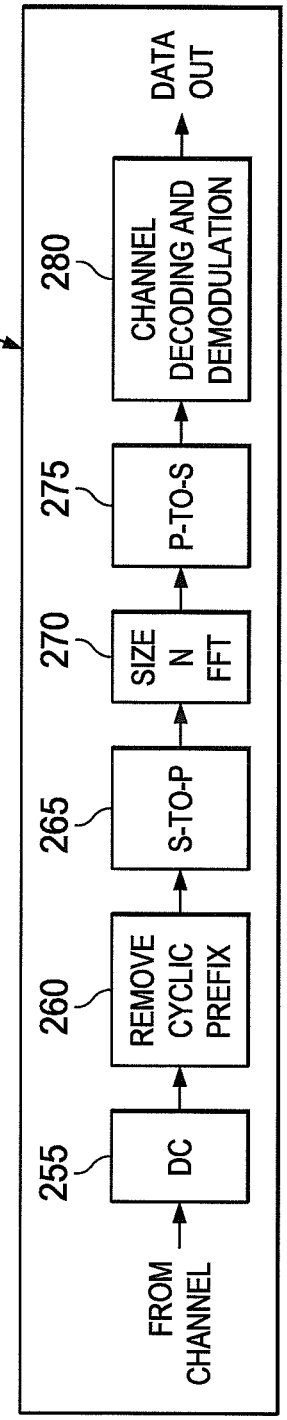

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in mobile station (MS) 116 for the purposes of illustration and explanation only. However, it will be understood by those skilled in the art that the OFDMA receive path also can be implemented in BS 102 and the OFDMA transmit path can be implemented in MS 116.

The transmit path in BS 102 includes channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in MS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B can be implemented in software while other components can be implemented by configurable hardware or a mixture of software and configurable hardware. In particular, it is noted that the FFT blocks and the IFFT blocks described in this disclosure document can be implemented as configurable software algorithms, where the value of Size N can be modified according to the implementation.

In BS 102, channel coding and modulation block 205 receives a set of information bits, applies LDPC coding and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and MS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal can also be filtered at baseband before conversion to RF frequency.

The transmitted RF signal arrives at MS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes (i.e., performs LDPC decoding) the modulated symbols to recover the original input data stream.

Each of base stations 101-103 implement a transmit path that is analogous to transmitting in the downlink to mobile stations 111-116 and implement a receive path that is analogous to receiving in the uplink from mobile stations 111-116. Similarly, each one of mobile stations 111-116 implement a transmit path corresponding to the architecture for transmitting in the uplink to base stations 101-103 and implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more context-based operation reconfigurable instruction set processors (CRISPs), such as the CRISP processor(s) described in one or more of application Ser. No. 11/123,313; filed May 6, 2005 and entitled "Context-Based Operation Reconfigurable Instruction Set Processor And Method Of Operation"; U.S. Pat. No. 7,769,912, filed Jun. 1, 2005 and entitled "MultiStandard SDR Architecture Using Context-Based Operation Reconfigurable Instruction Set Processors"; U.S. Pat. No. 7,483,933, issued Jan. 27, 2009 and entitled "Correlation Architecture For Use In Software-Defined Radio Systems"; application Ser. No. 11/225,479, filed Sep. 13, 2005 and entitled "Turbo Code Decoder Architecture For Use In Software-Defined Radio Systems"; and application Ser. No. 11/501,577, filed Aug. 9, 2006 and entitled "Multi-Code Correlation Architecture For Use In Software-Defined Radio Systems", all of which are hereby incorporated by reference into the present application as if fully set forth herein.

FIG. 3 illustrates a parity check H-matrix associated with a LDPC encoding scheme according to embodiments of the present disclosure. The embodiment of the H-matrix 300 shown in FIG. 3 is for illustration only. Other embodiments could be used without departing from the scope of this disclosure.

The H-matrix 300 as shown is a ½ code rate H-matrix conforming to the WiGig standard. In other embodiments, the H-matrix can have any suitable rate, such as a ⅝, ¾, or a 13/16 code rate. Additionally, the H-matrix 300 shown has a block size (N) of 672 bits with a lifting factor (Z) of 42. Other embodiments of H-matrices for use with the present disclosure can have other block sizes and lifting (Z) factors.

The rate ½ H-matrix 300 is a 672×336 matrix that represents a transmission of 672 bits per frame (bpf). In the H-matrix 300, the first eight columns 302 represent systematic (or data) bits while the second eight columns 304 represent parity (or redundancy) bits. Each number represents the cyclic shifts of the identity matrix of size Z-Factor-by-Z-Factor bits. The Z-factor defines the number of bits per matrix. For example, the Z-Factor as shown is set to '42'. As such, using the H-matrix shown, each frame in the transmission includes 336 systematic bits and 336 parity bits. A '−1' value represents a zero matrix. Accordingly, the '−1' value indicates that the location is not used in the calculation. The remaining values (i.e., those having values other than '−1') are location values that represent a matrix.

Each row in the H-matrix 300 forms a layer, which consists of '42' contention free check nodes, and can be processed in parallel without contention. An iteration (computing VN-to-CN messages, CN-to-VN messages, and updating VNs LLR values), in a layered decoder, consists of several sub-iterations. One sub-iteration per layer, where all check nodes in the layer are updated in parallel.

Figure 4:
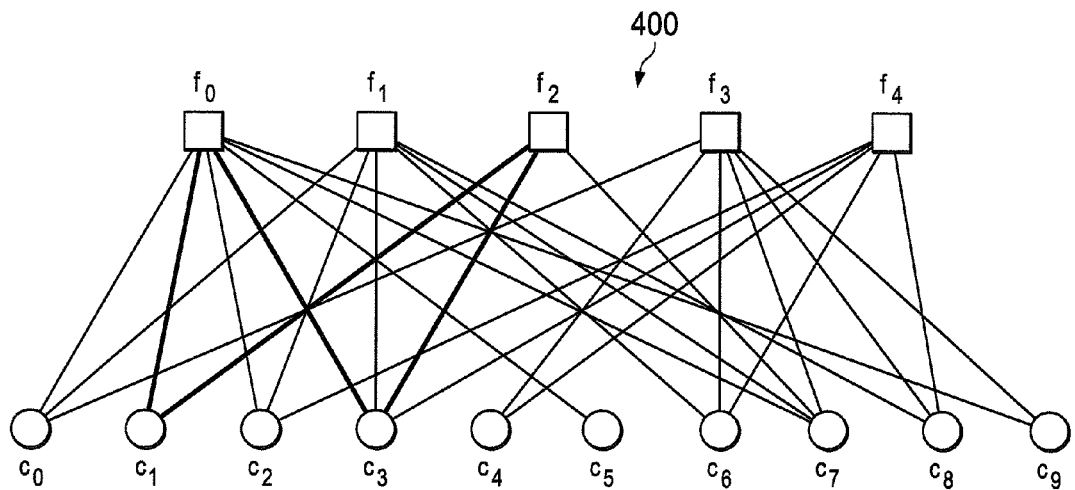
FIG. 4 illustrates a tanner graph that corresponds to a parity check matrix according to embodiments of the present disclosure.

FIG. 4 illustrates Tanner graph 400 that corresponds to a parity check matrix according to embodiments of the present disclosure. The embodiment of Tanner graph 400 shown in FIG. 4 is for illustration only. Other embodiments of Tanner graph 400 can be used without departing from the scope of this disclosure.

Tanner graph 400 is a bipartite graph. In bipartite graphs, nodes are separated into two distinctive sets and edges only connect nodes of two different types. The two types of nodes in Tanner graph 400 are referred to as variable nodes (hereafter, "v-nodes") and check nodes (hereafter, "c-nodes").

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

Tanner graph 400 corresponds to the parity check H-matrix illustrated by Equation 1. Tanner graph 400 includes five (5) c-nodes (the number of parity bits) and ten (10) v-nodes (the number of bits in a codeword). C-node fi is connected to v-node $c_j$ if the element $h_{ij}$ of H-matrix is a binary 1. For example, c-node f0 is connected $c_0$, $c_1$, $c_2$, $c_3$, $c_5$, $c_7$ and $c_9$. The connection between $f_0$ and $c_0$ corresponds to $h_{00}$; the connection between $f_0$ and $c_2$ corresponds to $h_{01}$; and so on. Therefore, the connections to $f_0$ correspond to the first row in the H-matrix, further illustrated in Equation 1:

$$\vec{H}_0=[1\ 1\ 1\ 1\ 0\ 1\ 0\ 1\ 0\ 1] \quad\quad [\text{Eqn. 1}]$$

A degree of a node is the number of edges (e.g., connections) connected to the node.

Low Density Parity Check codes (LDPC) have recently received considerable attention in the error control coding field, due to the low complexity in implementation of decoding algorithms. Furthermore, this class of codes performs near the Shannon bound for relatively, long block lengths. Among different families of decoding algorithms, the well-known belief propagation (BP) algorithm provides a good decoding performance. However, the BP algorithm often requires large hardware complexity. A simplified variation of BP algorithm, referred to as a min-sum decoding algorithm, reduces the hardware complexity, but often at the cost of performance degradation. Recently, a normalized min-sum decoding algorithm has been implemented in many practical and finite precision applications since it provides acceptable decoding performance as compared to BP algorithm for regular codes. However, for the most irregular LDPC codes, the normalized min-sum decoding algorithm can perform relatively poorly under finite precision implementation conditions.

Most irregular LDPC codes typically have a large amount of low-degree variable nodes. These variable nodes require more numbers of iterations to converge as compared to high-degree variables nodes. Furthermore, finite precision decoding techniques further decreases the convergence rate of the low-degree variable nodes due to quantization effects. Various min-sum algorithms have been proposed to improve the decoding performance, but at the cost of slower convergence rate and higher hardware complexity. For instance, it has been proposed that the variable nodes can use down-scaled intrinsic information iteratively to improve the reliability of extrinsic information at the variable nodes. The down-scaling in intrinsic values, however, can reduce the convergence speed.

Furthermore, the down scaling factor often needs to be optimized for a specific number of iterations.

Figure 5:
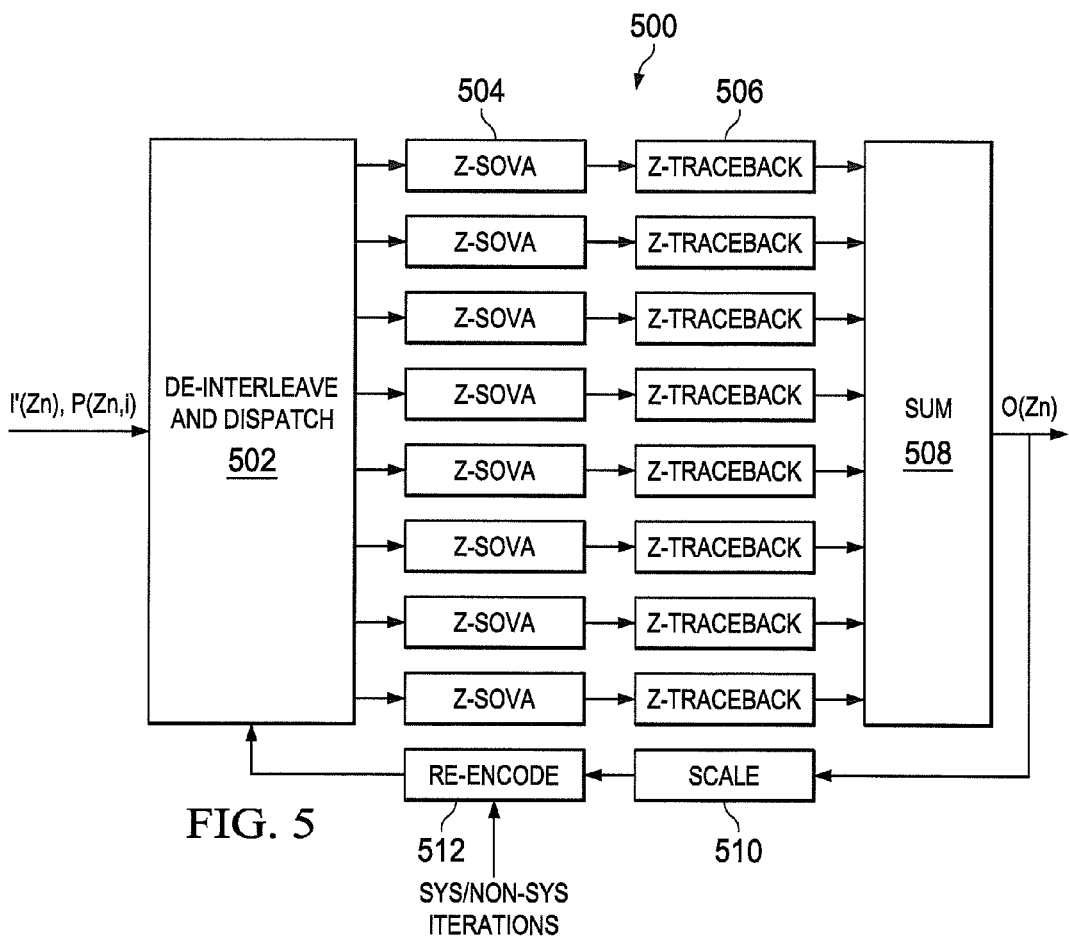
FIG. 5 illustrates an example soft output Viterbi algorithm (SOVA) based ML flooding decoder according to certain embodiments of the present disclosure.

FIG. 5 illustrates an example soft output Viterbi algorithm (SOVA) based ML flooding decoder 500 according to certain embodiments of the present disclosure. The embodiment of the decoder 500 shown in FIG. 5 is for illustration only. Other embodiments of decoders can be used without departing from the scope of this disclosure.

The decoder 500 includes a de-interleaving and dispatch input 502, corresponding multiple SOVA decoding processors 504 and Z-traceback units 506, a summing unit 508, a scaling block 510, and a re-encoding decision block 512. The scaling block 510 and re-encoding decision block 512 forms an iterative feedback path where the soft decision outputs can be fed back to the input with a scaling factor.

The de-interleaving and dispatch input 502 receives Z-group codewords corresponding to the systematic (non-systematic) $I(Z_n)$ ($I'(Z_n)$) and related parity $P(Z_{n,i})$ Log Likelihood Ratios (LLRs), de-interleaves the codewords based on the original block code H-Matrix mod(Z) cyclic shift. Then the de-interleaved z-group codewords are dispatched based on the H-Matrix to the related decoding processors 504. Each decoding processor 504 processes z-group of CNs in parallel. Each of the decoding processors 504 keeps in memory both the soft decision data for each bit derived from the difference in the probability (Path Metric) deciding "1" and "0". The decoding processors 504 also save the polarity (Trellis) history for each bit. The Path Metric Memory can be saved using the in-place memory thus enabling a single Path Metric (PM) memory instead of the conventional current and next PMs.

The non-systematic $I'(Z_n)$ and related parity $P(Z_n)$ Log Likelihood Ratios (LLRs) are first de-interleaved based on the original block code H-Matrix mod(Z) cyclic shift. Then the de-interleaved z-group codeword dispatched based on the H-Matrix to the related Z-SOVA decoding processors 504. Each decoding processor 504 processes z-group of CNs (SOVA Decoders) in parallel. The decoding processors 504 keep in memory both the soft decision data for each bit derived from the difference in the probability (Path Metric) deciding "1" and "0". It also saves the polarity (Trellis) history for each bit. The Path Metric Memory can be saved using the in-place memory thus enabling a single Path Metric (PM) memory instead of the conventional current and next PMs.

The decoding processors 504 function as parallel Viterbi decoders to process different rows in the continuous H-Matrix. In LDPC block codes, each row is effectively different parity check processor that is called a check node (CN). There are $N_b(1-R_b)$ CNs in a block code. Analogously to a convolutional code decoder, there are $N_b(1-R_b))$ parallel ML (Viterbi) decoders. Where, each Viterbi decoder has the following parameters: i) a Constraint-Length CL=J+1, ii) a Rate $R_v$=R or punctured R, a soft output Viterbi algorithm (SOVA), and flexible traceback and latency.

As described above, the syndrome former memory of the convolutional code $m_s$ can be too big for practical ML decoding. However, the actual effective constraint-length (CL) is small CL=J+1, which makes the ML decoder 500 feasible for implementation. Similar to a conventional LDPC block code decoder, the CNs (e.g., Viterbi decoders) are grouped in z-groups based on the code lifting factor Z. Each z-group processes different z-group row in the H-Matrix in which each z-grouped row can be independently processed by encoding processors 504. In certain embodiments, $N_b(1-R_b)/Z$ decoding processors 504 are provided. In other embodiments, any suitable quantity of processors can be used.

Figure 6:
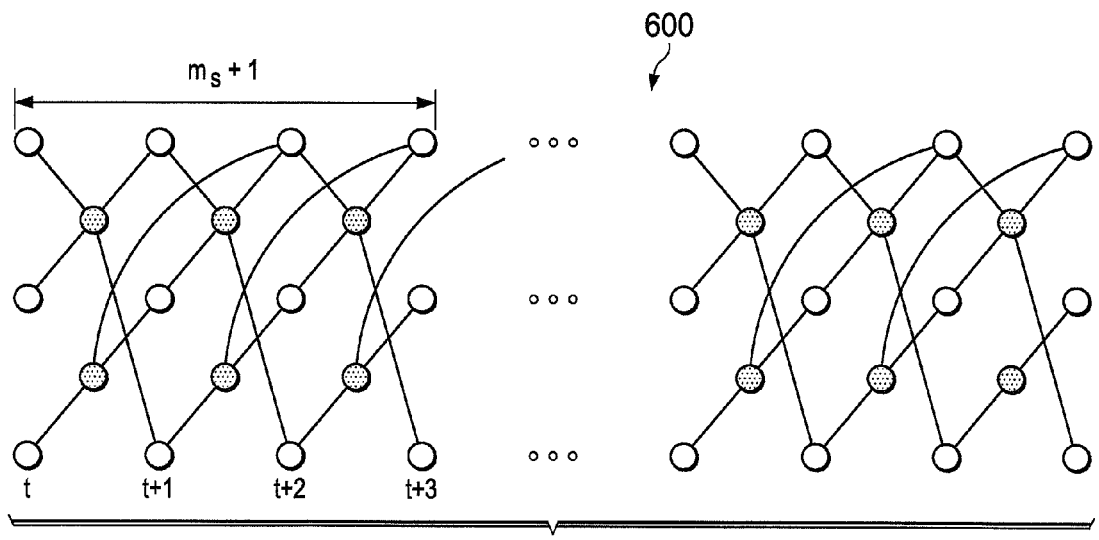
FIG. 6 illustrates an example continuous tanner graph that can be used by the decoder of FIG. 5 according to embodiments of the present disclosure.

FIG. 6 illustrates an example continuous tanner graph 600 used by the LDPC convolutional decoder 500 of FIG. 5 according to embodiments of the present disclosure. The embodiment of the continuous tanner graph 600 shown in FIG. 6 is for illustration only. Other embodiments of continuous tanner graphs 600 can be used without departing from the scope of this disclosure.

As shown, the continuous tanner graph 600 has an infinite number of variable nodes that are continuously formed into an ongoing signal stream. The distance between two variable nodes that are connected to the same check node is limited by the syndrome former memory (e.g., $(m_s+1)$) of the code. This feature provides continuous decoding that operates on a finite window sliding along the received sequence, similar to a Viterbi decoder with finite path memory. Thus, the decoding of two variable nodes that are at least $(m_s+1)$ time units apart can be performed independently (e.g., a constraint-length CL=$m_s$+1), since the corresponding bits cannot participate in the same parity-check equation. The particular continuous tanner graph 600 shown includes a simple time-invariant rate R=⅓ LDPC convolutional code. In other embodiments, any continuous tanner graph having any suitable code rate can be used.

A major challenge in LDPC block codes is the processing latency of the decoder. This latency typically affects the overall system efficiency and the effective data rate. In addition, block codes often have fewer granularities in their supported block sizes. For example, in the WiGig standard, the only supported block size is 672-bits. The single 672-bit block size is selected to fit one OFDM symbol using QPSK modulation. However, the standard additionally supports other modulation schemes such as 16-QAM (1344 bits) and 64-QAM (2016 bits); however, the LDPC block size does not change to fit the newly added OFDM symbol bits. This low granularity means that the LDPC code cannot take advantage of the bigger block sizes to reduce Frame-Error-Error (FER) and power consumption. In addition, packets sent from the Application Layer (AL) to the Physical Layer (PHY) such as video packets often have a relatively large number of bits compared to the PHY block code which can reduce efficiency.

LDPC codes have been considered to be too complex to be efficiently implemented in hardware. Additionally, power efficiency concern in supporting Near-ML decoding at Gigabit rates was also perceived to be difficult. Thus, increasing the block code size would result in higher latency and HW complexity which implies higher power consumption. Alternatively, however, reducing the block code size to support better granularity would result in poor FER performance. The increased power consumption issue is particularly important in the case of battery-powered mobile devices. Thus, certain embodiments of the LDPC decoder provide a relatively high processing rate while providing a relatively low decoding latency. The proposed QC-LDPC convolutional code is derived from an existing QC-LDPC block code by inheriting its characteristics. The SOVA-based ML decoder architecture leverages this structure efficiently to decode the bits. It results with high granularity code that enables low power high performance decoding.

In general, a code sequence of a convolutional code can be obtained as the output of a convolutional encoder, which is a linear system. Thus, a code sequence is obtained by the convolution of an information sequence with some given generating sequence. In a convolutional code, the information sequence is continuously encoded into a code sequence. Further, the output of a convolutional encoder is dependent on information symbols both at the current and previous times. A regular LDPC convolutional ($m_s$,J,K) code, includes a code defined by a syndrome former $H^T$, having exactly J ones in each row, where $j \ll (c-b)m_s$, and K ones in each column. For completely specifying an LDPC convolutional code it is also necessary to define b and c. With J and K fixed, the syndrome former of a convolutional code can be made sparse by increasing one or both of (c−b) and $m_s$.

An $(m_s, J, K)$ regular LDPC convolutional code is the set of sequences v satisfying $\bar{v}H^T = \bar{0}$, according to Equation 2.

$$H^T = \begin{bmatrix} H_0^T(t) & \cdots & H_{m_s}^T(t+m_s) \\ & H_0^T(t) & \cdots & H_{m_s}^T(t+m_s) \\ & \ddots & & \ddots \\ & & H_0^T(t) & \cdots & H_{m_s}^T(t+m_s) \\ & & & \ddots & & \ddots \end{bmatrix} \quad \text{[Eqn. 2]}$$

Here, $H^T$ is the (time-varying) semi-infinite syndrome former (transposed parity-check) matrix. For a rate R=b/c, b<c, LDPC convolutional code, the elements $H_i^T(t), i=0, 1, \ldots, m_s$ are binary c(c−b) submatrices defined according to Equation 3.

$$H_i^T(t) = \begin{bmatrix} h_i^{(1,1)}(t) & \cdots & h_i^{(1,c-b)}(t) \\ \vdots & \ddots & \vdots \\ h_i^{(c,1)}(t) & \cdots & h_i^{(c,c-b)}(t) \end{bmatrix} \quad \text{[Eqn. 3]}$$

Starting from the $m_s(c-b)$-th column, $H^T$ has J ones in each row and K ones in each column. The value $m_s$, called the syndrome former memory, is determined by the maximal width of the nonzero area in the matrix $H^T$, and the associated constraint length is defined as $v_s = (m_s + 1)c$.

In practical applications, periodic syndrome former matrices are of interest. Periodic syndrome formers are said to have a period T if they satisfy $H_i^T(t) = H_i^T(t+T)$, i=0, 1, ..., $m_s$, t∈Z.

An important main issue with pipeline architectures is that it is iterative with bit-wise granularity and deals with a very large $m_s$ (e.g., 100000's of bits) which results with high complexity and even bigger latency which make it impractical to be implemented in power efficient devices. According to certain embodiments of the present disclosure, the LDPC decoder will deal with small fixed (c−b) and medium $m_s$ (i.e. 672-bits) matrices to allow power efficient implementation. The high correlation between selecting the code and selecting the LDPC decoding method can be achieved. This correlation can help us efficiently decode the codeword with high performance in terms of power consumption efficiency and overall Bit-Error-Rate (BER), even with medium $m_s$ size.

In order to achieve performance sufficient to process data in currently used communication links in real time, an LDPC convolutional code should have a large value of $m_s$. Also, because LDPC convolutional codes typically have large constrained lengths, Belief Propagation (BP) techniques are used rather than trellis-based decoding algorithms that are often difficult to implement.

According to certain embodiments of the present disclosure, a new approach to QC-LDPC convolutional codes utilizing small and fixed values of (C−B) and medium $m_s$ (i.e. 336-bits) matrices with medium granularity (i.e. 42, 84-bits) and low number of iterations can be used to provide a relatively high processing rate with low latency and power-efficient encoder/decoder implementation supporting both BP and Trellis-based (SOVA) decoding. Additionally, the QC-LDPC convolutional codes can use systematic as well as non-systematic (e.g., XOR systematic codes), such as those codes implemented according to the WiGig standard. An example encoder configured to process systematic or non-systematic codes will be discussed in detail below.

Figure 7:
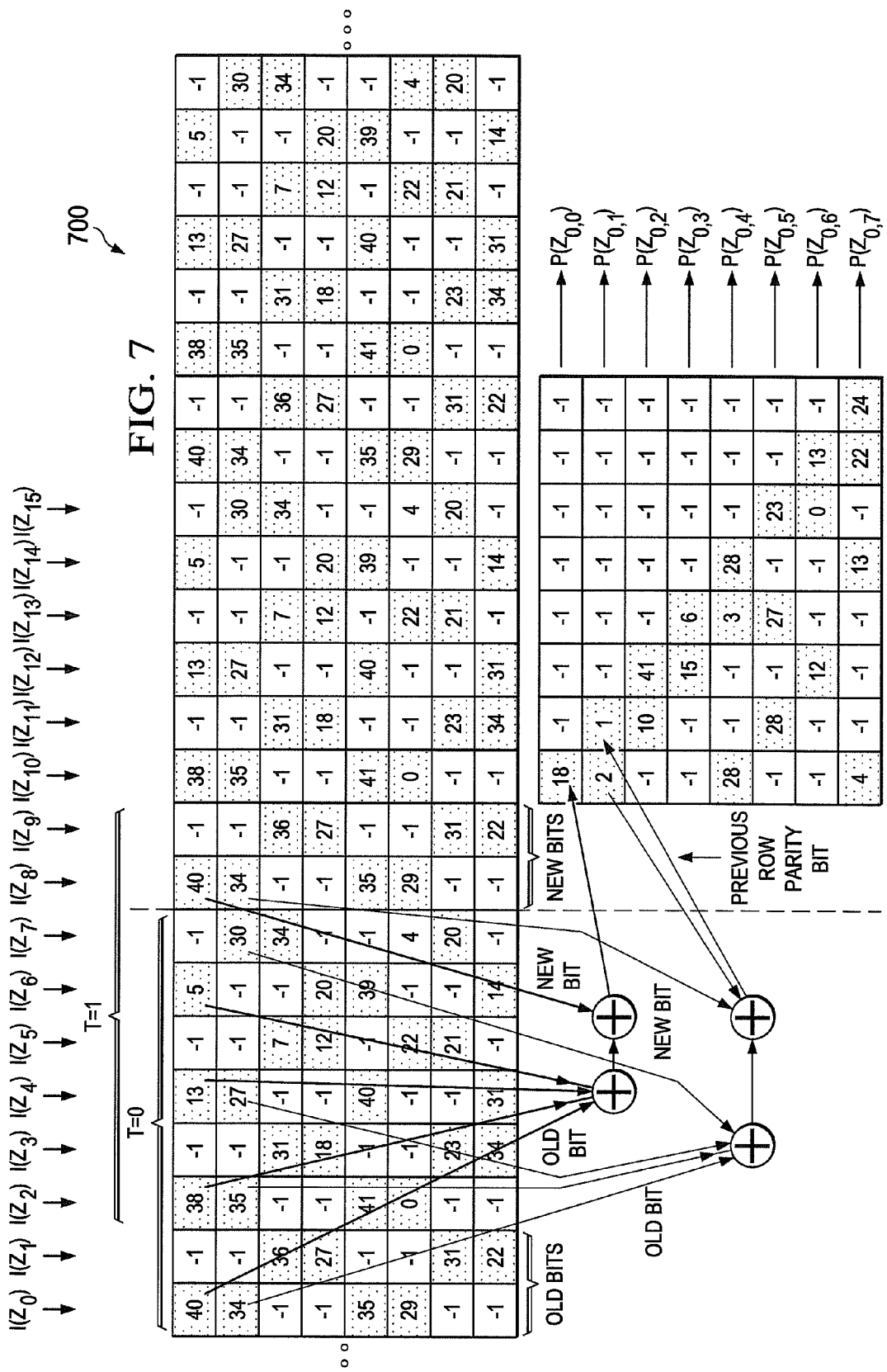
FIG. 7 illustrates an example continuous H-matrix that can be processed by the LDPC convolutional decoder of FIG. 5 to decode a continuous H-matrix according to embodiments of the present disclosure.

FIG. 7 illustrates an example continuous H-matrix 700 that can be processed by the LDPC convolutional decoder 500 of FIG. 5 to decode a continuous H-matrix according to embodiments of the present disclosure. The embodiment of the process 700 shown in FIG. 7 is for illustration only. Other embodiments of a continuous decoding process 700 can be used without departing from the scope of this disclosure. Additionally, in the particular embodiment shown, the continuous H-matrix is generated from a rate ½ matrix as shown in FIG. 3. In other embodiments, however, any suitable rate H-matrix can be used.

Like the H-matrix of FIG. 3, the continuous H-matrix 700 is decoded by separately processing a systematic portion 702 of the continuous H-matrix relative to a parity check portion 704 of the H-matrix. For example, in the present case in which the H-matrix is a rate ½ matrix, the continuous H-matrix 700 can be cut in half due to the fact that the parity check portion 704 is similar in size to the systematic portion 702. Next, the systematic part 702 is repeatedly processed to create a semi-infinite systematic flow. That is, the systematic portion 702 is concatenated into successive, recurring systematic blocks that are separated by a specified symbol interval and individually processed by processors 500. Additionally, the parity check portion 704 is repeated accordingly for every Z-group systematic bits.

The systematic is encoded as parallel convolutional code horizontally with new k×z-group of bits (k∈[1, 2, ...]) entered at time t=nT replacing the corresponding k×z-group of bits entered at time $t = nT - N_b R_b T/Z$, where $N_b$ is the block code size, $R_b$ is the block code rate and Z is the lifting factor. The parity is added every T.

As shown in FIG. 7, the parity bits of the parity check portion 704 to be processed are selected based on the newly affected rows by the last entered k×z-group codeword. For an example in which k=1, at time t=0, the last entered z-group input is $I(Z_7)$ which affects z-group rows 2, 3, 6, and 7. This means that the parity bits related to z-group rows 2, 3, 6, and 7 will be outputted. The new constructed convolutional code has the following parameters derived from the original block code:

$$m_s = N_b R_b \quad \text{[Eqn. 4]}$$

$$j = w'_r, \quad K = w_c \quad \text{[Eqn. 5]}$$

$$R = \frac{1}{w_c + 1} \quad \text{[Eqn. 6]}$$

It can be seen from Equations 4, 5, and 6 that the transformation, from the block code parameters to the corresponding convolutional code parameters, is relatively complete and well defined. The convolutional code has inherited its syndrome former memory $m_s$ from $N_b R_b$ which guarantees that the memory and latency of the new derived convolutional code is similar to the medium size block code. The main difference between the block code and the derived convolutional code is the rate. According to the WiGig standard, the block code rate is $R_b = ½$, while the convolutional code rate is R=⅕. Further rate reduction can be achieved by puncturing either the (non) systematic or the parity bits (or both) of the encoded codeword.

In certain embodiments, the continuous H-matrix 700 can include non-systematic codes $I'(Z_{n+B})=I(Z_{n+B})+I(Z_n)$ instead of $I(Z_{n+B})$ as done in systematic codes. The final transmitted encoded stream at rate $R=1/(C-B+1)$, assuming $n=s\times B$, where s is integer $-\infty<s<\infty$ will be for systematic code: ... $I(Z_n)$, $P(Z_{n,0})$, $P(Z_{n,1})$, $P(Z_{n,2})$, ... $P(Z_{n,C-B-1})$, $I(Z_{n+1})$, $P(Z_{n+1,0})$, $P(Z_{n+1,1})$, $P(Z_{n+1,2})$, ... $P(Z_{n+1, C-B-1})$..., and for non-systematic code: ... $I'(Z_n)$, $P(Z_{n,0})$, $P(Z_{n,1})$, $P(Z_{n,2})$, ... $P(Z_{n,C-B-1})$, $I'(Z_{n+1})$, $P(Z_{n+1,0})$, $P(Z_{n+1,1})$, $P(Z_{n+1,2})$, ... $P(Z_{n+1, C-B-1})$..., where $I'(Z_{n+B})=I(Z_{n+B})+I(Z_n)$.

Figure 8:
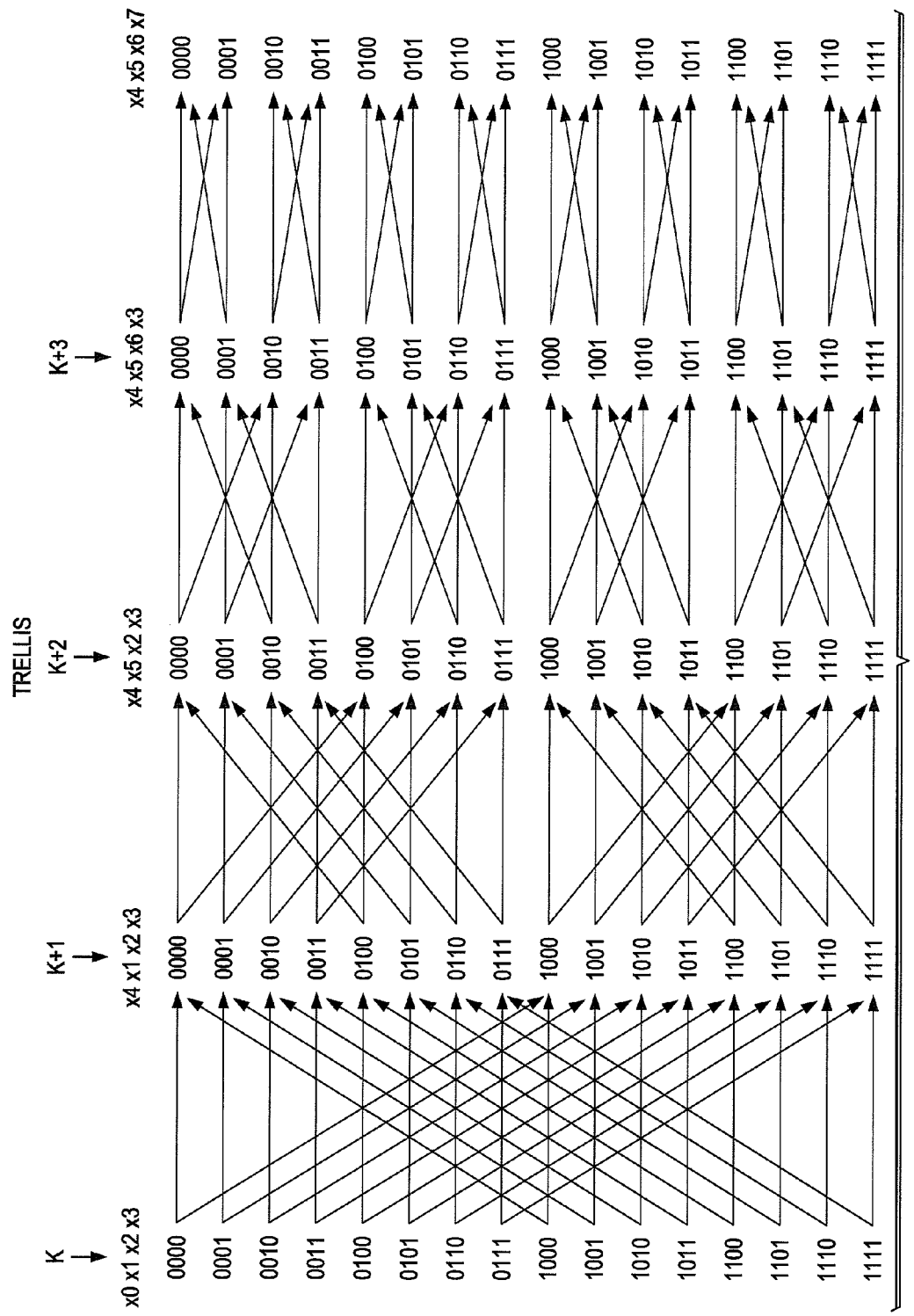
FIG. 8 illustrates an example trellis diagram showing how individual rows of the continuous H-matrix are decoded by the LDPC decoder according to certain embodiments of the present disclosure.

FIG. 8 illustrates an example trellis diagram showing how individual rows of the continuous H-matrix are decoded by the LDPC decoder 500 according to certain embodiments of the present disclosure. The embodiment of the process 800 shown in FIG. 8 is for illustration only. Other embodiments of a trellis diagram can be used without departing from the scope of this disclosure. Additionally, the particular trellis diagram shown is an in-place trellis with CL=5; however, other embodiments can use any suitable type of trellis diagram with any suitable CL value.

The trellis diagram 800 includes a successive number of iterative traceback functions. After feed-forward (FF) processing several z-group inputs ($n\times m_s/Z$, $n\geq5$), the oldest data probability is high enough to perform a traceback function. Similarly, in this case, the Traceback is z-grouped and performed in parallel (Z-Traceback). The initial state for the Traceback is set to a known state (i.e. 0), or it is based on the state that related to the PM that provides the highest probability out of all the states in the last stage. A highest probability can be determined by the minimum value for Euclidean Distance Branch Metric (BM) method, or maximum value for Manhattan Distance Branch Metric method.

The Z-Traceback process is divided into a Learning Period (LP) where the Traceback is performed but no decision is done, and Output Period (OP) where the Traceback is performed and soft decision is output. The LP is used whenever that end of the codeword has not been reached. Usually, in convolutional codes, the codeword is split into overlapping segments to be parallel processed by multiple ML decoders. In this case, the LP is equal to the overlapping segments. The ratio between the LP period and the overall Traceback (TB) period is flexible and mostly depends on the performance or data rate required to be achieved per Signal-to-Noise Ratio (SNR). In most cases, the Traceback period is pipelined with the Feed-Forward period to further increase processing rate. The next stage is to sum all the related soft decisions outputs from all the Z-Traceback blocks. The soft decisions are aligned based on the H-Matrix. The maximum number of summed soft decision outputs is K.

Figure 9:
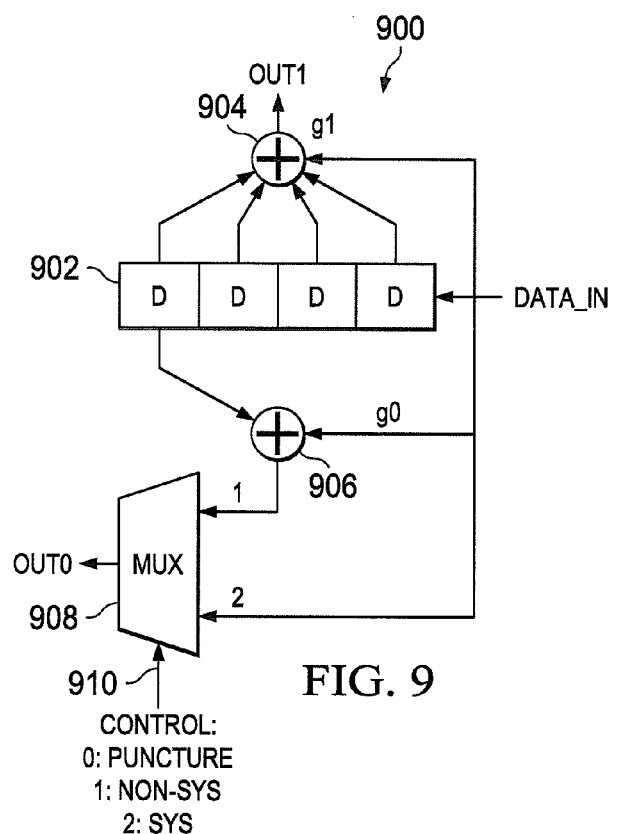
FIG. 9 illustrates an example rate ½ convolutional encoder according to certain embodiments of the present disclosure.

FIG. 9 illustrates an example rate ½ convolutional encoder 900 according to certain embodiments of the present disclosure. The embodiment of the encoder 900 shown in FIG. 9 is for illustration only. Embodiments of other encoders could be used without departing from the scope of this disclosure.

The encoder 900 includes register blocks 902 for temporary storage of input data, a first algorithm block 904 for performing LDPC encoding of the stored data, a second algorithm block 906 that provides an output to a multiplexer 908. The multiplexer 908 is controlled by a control input 910 to alternatively select systematic, non-systematic, or punctured output data.

The different CNs can be described as path metric (PM) nodes that are derived from separate rows in the Parity Generator Matrix. Even though the Syndrome Former Memory $m_s$ of the QC-LDPC convolutional code is not small, the actual Constraint Length (CL) of the convolutional code per row is only CL=5. Thus, trellis-based decoding can be performed even though $m_s$ is not small. The rate of the new convolutional code derived from Rate WiGig Block Code depends on the convolutional encoder switch.

The selected encoder polynomials can be established according to Equation 7.

$$[g0,g1]=[21,37]\ Octal \qquad [Eqn.\ 7]$$

Encoder polynomial $g_1$ is selected directly from the LDPC code itself while encoder polynomial $g_0$ can be selected in several ways. In order to increase the rate to make it closer to the original block code Out0 can be avoided from transmitting Out0 and transmitting only Out1 (e.g., option 0). Note that additional code puncturing can be used to get to higher rates such as ½ and above. Other options can include transmitting out0 based on $g_0$ for non-systematic transmission (e.g., option 1), or to send directly the systematic data through Out0 (e.g., option 2).

Figure 10A:
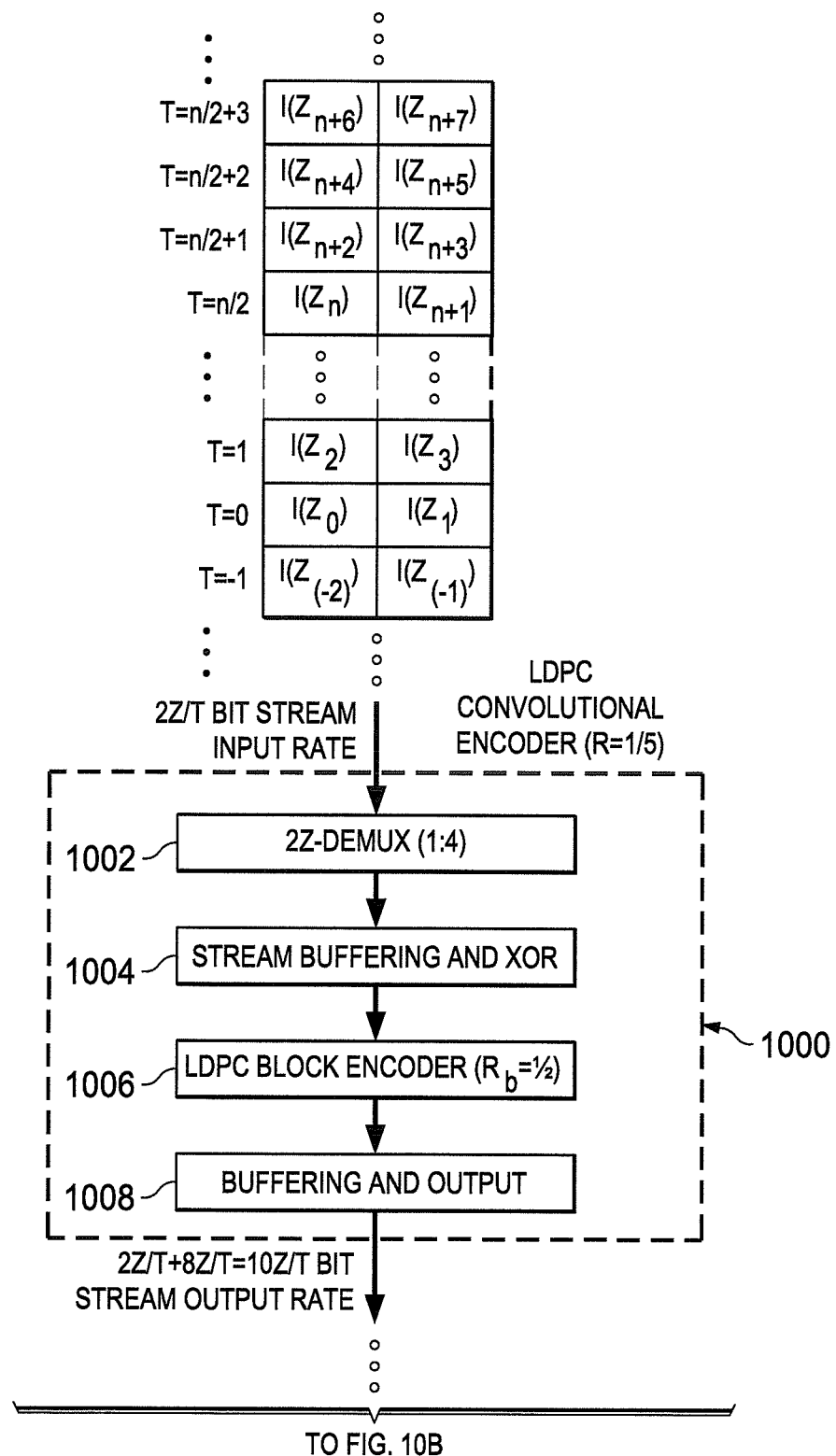
Figure 10B:
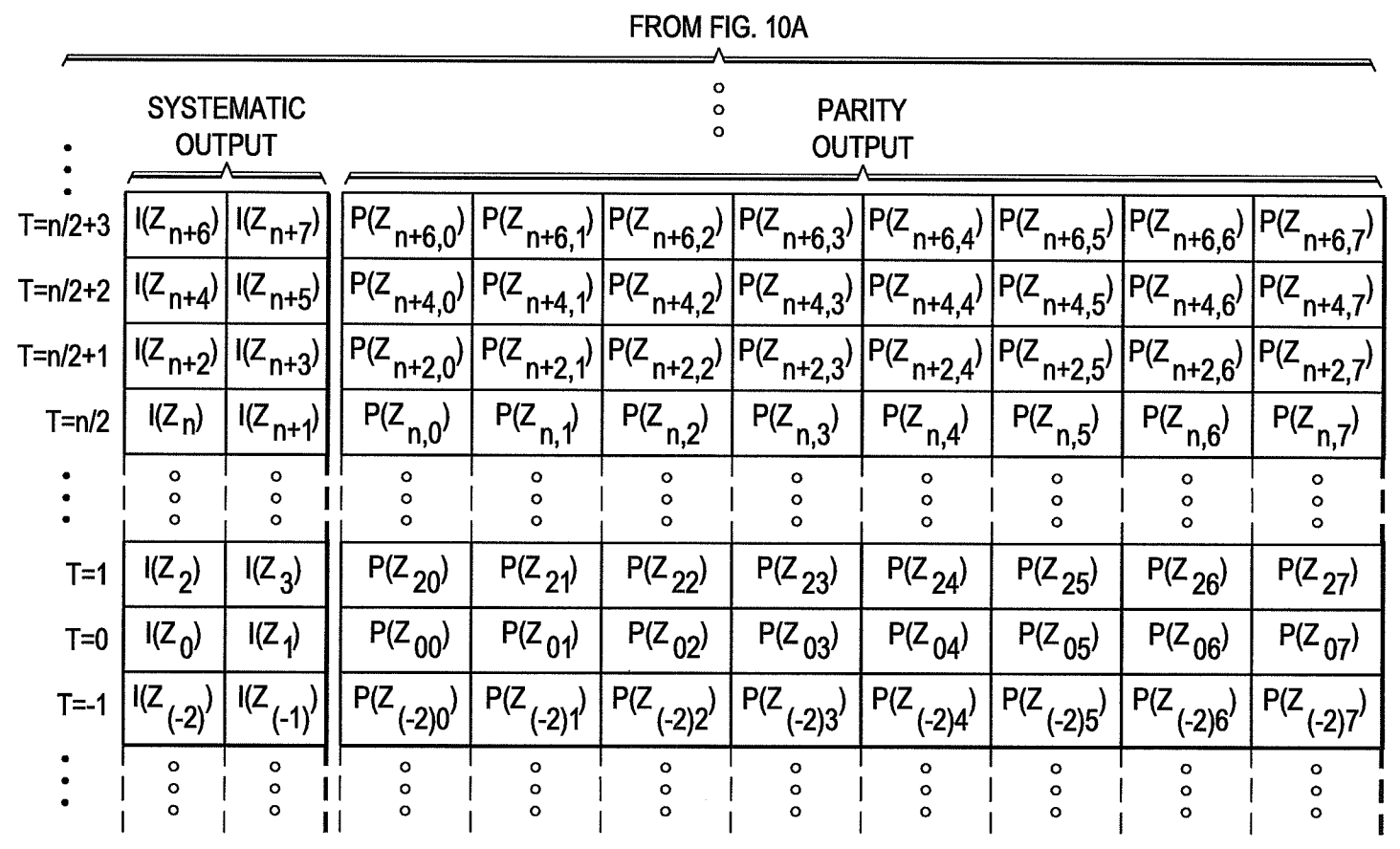

FIGS. 10A and 10B illustrate an example QC-LDPC convolutional encoder 1000 according to certain embodiments of the present disclosure. The embodiment of the encoding architecture 1000 shown in FIGS. 10A and 10B is for illustration only. Embodiments of other encoders could be used without departing from the scope of this disclosure.

The QC-LDPC convolutional encoder 1000 includes a 2Z-Demux block 1002, a stream buffering and XOR block 1004, and an output buffering block 1006, a LDPC block encoder 1006, and an output buffering block 1008. The 2Z-Demux block 1002, the stream buffering and XOR block 1004, and the output buffering block 1008 are mainly used for data alignment. The LDPC block encoder 1006 provides the main core of the encoding architecture.

Figure 11A:
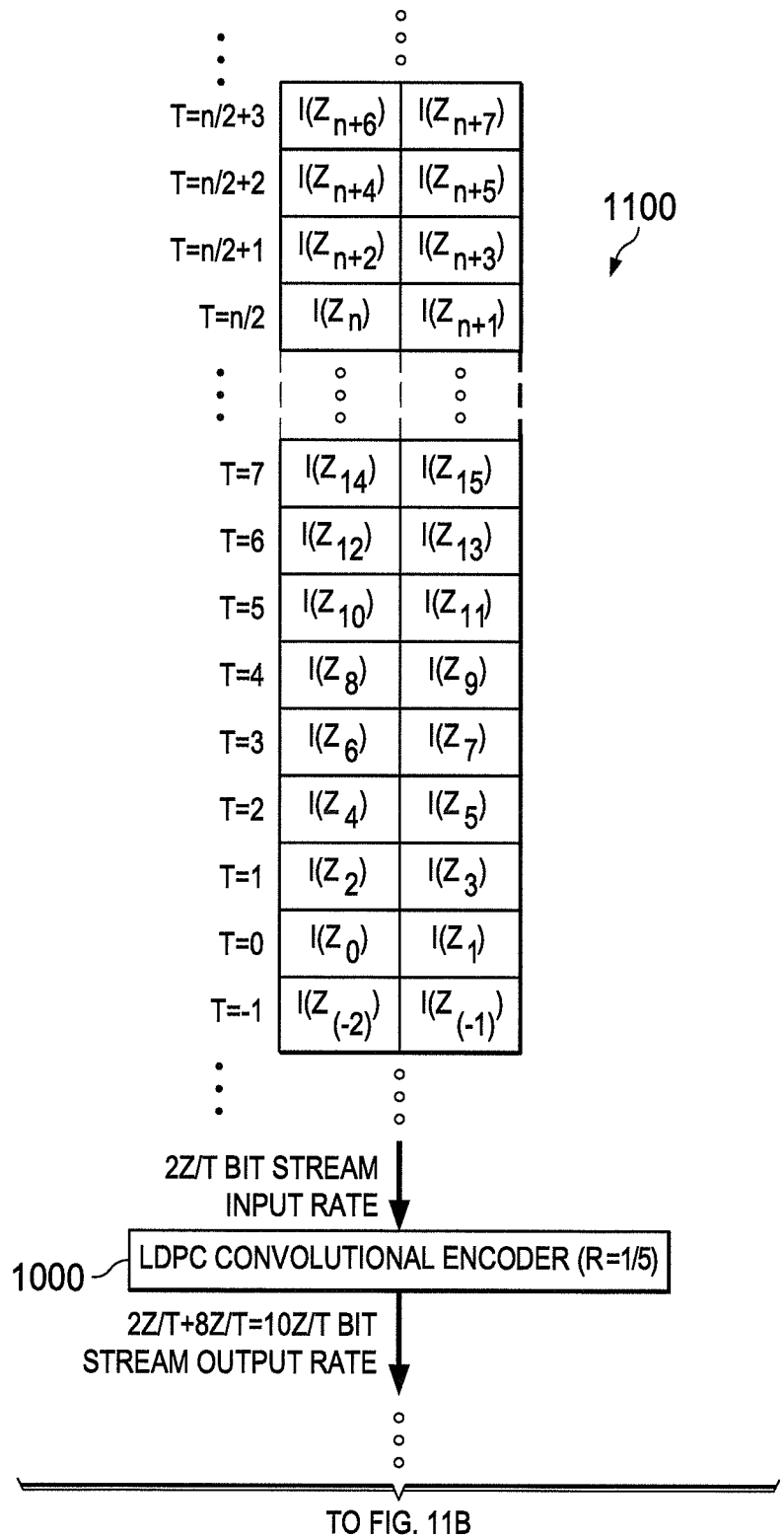
Figure 11B:
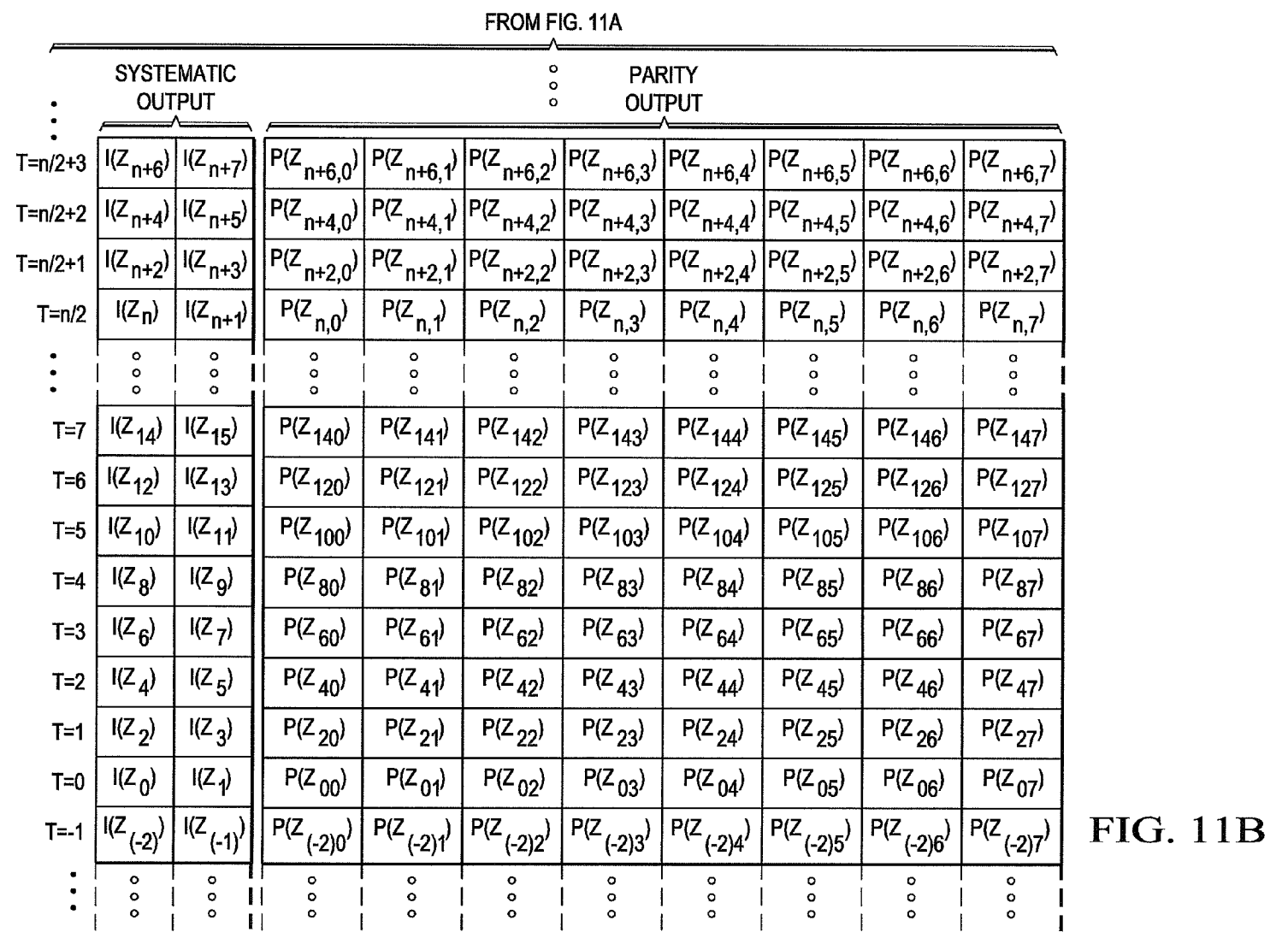

FIGS. 11A and 11B illustrate an example encoding process 1100 that can be performed by certain embodiments of the QC-LDPC convolutional encoder 1000 of FIGS. 10A and 10B. The encoding process uses the same parameters used in the above WiGig Example with G=2Z input granularity. Nevertheless, the same can be done for any tz, $1\leq t\leq B$. The scheduling of the convolutional encoding architecture is related to time unit T.

The stream buffering and XOR block 1004 prepares the bit stream to be converted to a convolutional stream. This effectively means that the independent input stream is converted to a dependent stream before the actual encoding process is performed. Two options to input the stream to the block encoder 1006. In certain embodiments, the input stream can be inputted using an XOR function for convolutional code. In another embodiment, the input stream can be inputted non-XOR for concatenated block code. One option can be to create the convolutional code as described in equation 8.

$$I'(Z_n)=I(Z_n)+I(Z_{n-8}) \qquad [Eqn\ 8]$$

The intention is to create dependency between $I(Z_n)$ and $I(Z_{n-8})$ to provide the convolutional fashion of the code by adding the transition from $I(Z_{n-8})$ to $I(Z_n)$ to construct the related parity bit. Adding both inputs $I(Z_n)$ and $I(Z_{n-8})$ without pre-QC shifting is allowed since as defined by the proposed QC-LDPC Convolutional Code it is guaranteed that $I(Z_n)$ and $I(Z_{n-8})$ are using the same QC shifting since both using the same column in the parity check H-Matrix.

Figure 12A:
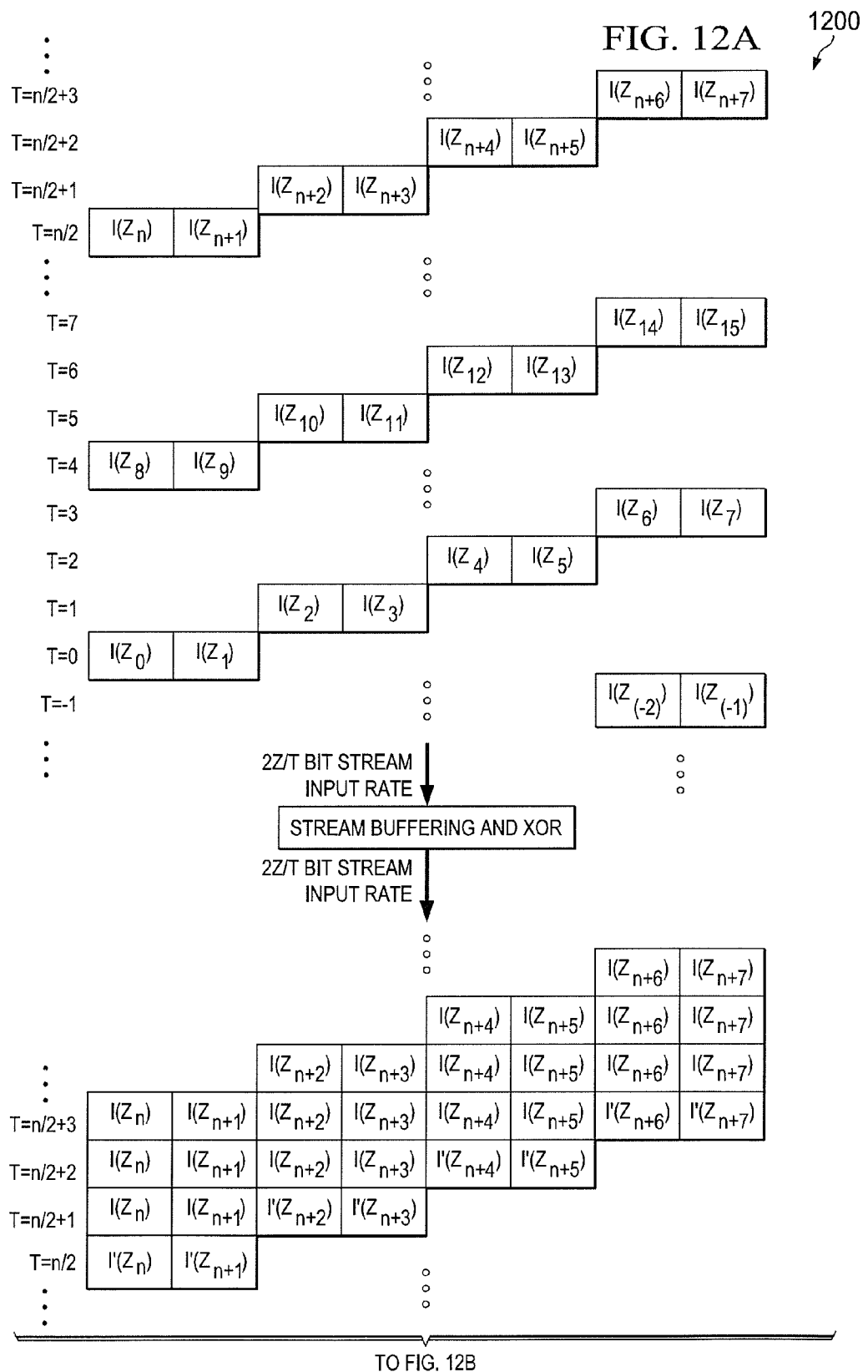
Figure 12C:
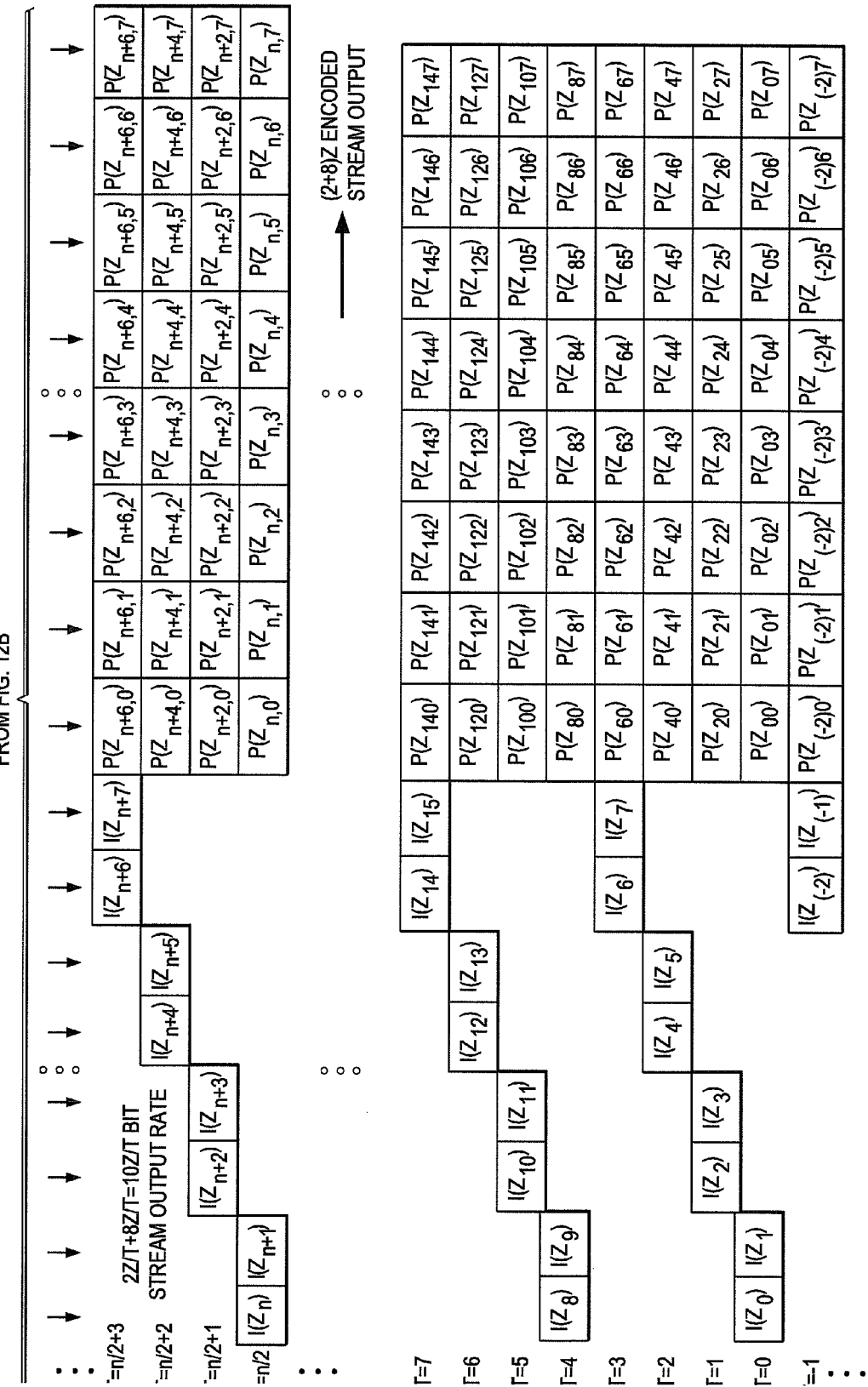

FIGS. 12A, 12B and 12C illustrate an example scheduling order 1200 that can be performed by certain embodiments of the stream buffering and XOR block 1104 of FIGS. 10A and 10B. The embodiment of the scheduling order 1200 shown in FIGS. 12A, 12B and 12C is for illustration only. Embodiments of other scheduling orders could be used without departing from the scope of this disclosure.

The scheduling order 1200 shown describes the input/output data scheduling to the QC-LDPC Block code in order to create the related QC-LDPC Convolutional code. Concatenated blocks are created and in this particular case $I'(Z_n)=I(Z_n)$. In this case, there is no dependency between the input bits to the LDPC block encoder.

Although FIGS. 10 through 12 illustrate one example of a QC-LDPC convolutional encoder 1000, encoding process 1100, and a scheduling order 1200 for encoding an input stream, various changes can be made to FIGS. 10 through 12. For example, other decoding options, such as BP-based decoders or trellis-based decoders can be used to decode any suitable input data stream.

Figure 13:
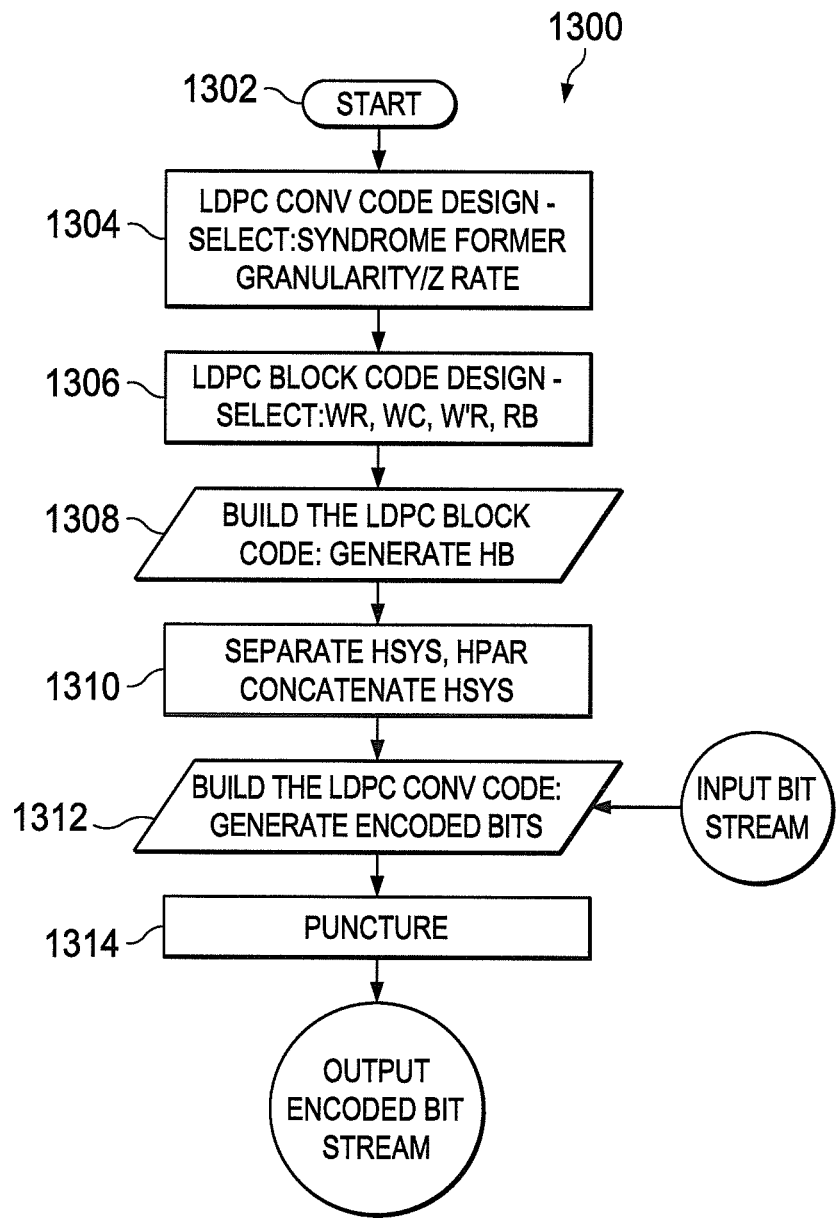
FIG. 13 illustrates an example low-power LDPC convolutional encoding process according to embodiments of the present disclosure.

FIG. 13 illustrates an example low-power LDPC convolutional encoding process 1300 according to embodiments of the present disclosure. The embodiment of the freezing-based LDPC encoding process 1300 shown in FIG. 13 is for illustration only. Other embodiments could be used without departing from the scope of this disclosure. In step 1302, the process is initiated.

In step 1304, a syndrome former granularity Z rate is selected for the encoder. The selection of the syndrome former granularity Z rate generally determines the level of encoding to be performed as opposed to the speed and efficiency of the encoding process. For example, a relatively high syndrome former granularity Z rate can provide a corresponding high level of encoding at the price of speed and performance. One the other hand, a relatively low syndrome former granularity Z rate provides less encoding, but with greater speed and efficiency.

In step 1306, the row weight (Wr) of the H-matrix, the column weight (Wc) of the H-matrix, the row weight (W'r) of the systematic portion, and the block code rate (Rb) of the LDPC block code is selected.

In step 1308, the LDPC block code (Hb) is constructed using the syndrome former granularity Z rate, Wr, Wc, W'r, and Rb selected in steps 1304 and 1306.

In step 1310, the LDPC convolutional encoder separates a systematic portion (Hsys) of the continuous H-matrix from a parity check portion (Hpar) of the continuous H-matrix, and concatenates the systematic portion. The systematic portion is generally associated with data or information to be encoded and the parity check portion includes additional bits used for encoding the systematic portion.

The LDPC convolutional encoder concatenates the systematic portion into successive, recurring, systematic blocks that are separated by a specified symbol interval. In certain embodiments, each systematic block is concatenated from a previous systematic block at intervals of $t=nT$ in which non-overlapping bits replace a corresponding z-group of bits entered at time $t=nT-N_b R_b T/Z$, where $N_b$ is the block code size, $R_b$ is the block code rate and Z is the lifting factor.

In step 1312, the LDPC convolutional encoder performs LDPC encoding of the systematic portion of an input bit stream using the parity check portion associated with the systematic portion using its associated parity check portion and outputs an encoded bit stream. In certain embodiments, the encoder uses a parity check portion that is repeated for every z-group of bits.

In certain embodiments, the encoder comprising a Viterbi encoder that performs LDPC encoding using a ML processing technique. In another embodiment, the encoder includes multiple processors that perform LDPC encoding of rows of the systematic portion simultaneously relative to one another.

In step 1314, the LDPC convolutional encoder optionally punctures certain elements of the systematic and/or parity bits of the encoded codeword. Puncturing of the systematic and/or parity bits can provide additional rate reduction in certain embodiments.

The above described LDPC encoding process continues throughout operation of the LDPC convolutional encoder. When encoding of the incoming bitstream encoded according to the continuous H-matrix is needed or desired, the process ends in step 1312.

Although FIG. 13 illustrates one example of a method 1300 for decoding a incoming bitstream encoded according to a continuous H-matrix codeword, various changes can be made to FIG. 13. For example, the steps can be performed in a different sequential order, or can be performed simultaneously relative to one another.

Although the present disclosure has been described with an exemplary embodiment, various changes and modifications can be suggested to one skilled in the art. It is intended that the present disclosure encompass such changes and modifications as fall within the scope of the appended claims.

What is claimed is:

1. A low-density parity check (LDPC) convolutional decoder comprising:
   an input configured to receive a continuous encoded data stream encoded using a modified H-matrix and a constraint length value, the modified H-matrix generated by:
      separating a data portion of a block code H-matrix from a parity portion of the block code H-matrix,
      concatenating repeated data portions of the block code H-matrix to create continuous data portions of the block code H-matrix, and
      applying the parity check portion to a continuous sub-stream of the a continuous data stream of bits defined by the modified H-matrix; and
   at least one processing element configured to:
      perform LDPC convolutional decoding of the continuous encoded data stream using the modified H-matrix and a constraint length value, the continuous encoded data stream including a plurality of successive, recurring data blocks using a plurality of associated parity check portions, the data blocks and their associated parity check portions comprising the modified H-matrix generated from the block code H-matrix, and
      for every continuous sub-stream bit defined by the modified H-matrix, output a plurality of bits depending on previous constraint lengths of the sub-stream data bits.

2. The LDPC decoder of claim 1, wherein the block code H-matrix comprises the data portion and a parity check portion separate from the data portion, and wherein the at least one processing element is configured to repeat the parity check portion for every k×Z-group of bits of the data portion.

3. The LDPC decoder of claim 1, wherein the continuous H-matrix comprises a code rate that conforms to the WiGig standard.

4. The LDPC decoder of claim 1, further comprising one or more traceback elements that are configured to perform a traceback of the decoded bits of the data portion in parallel according to a specified z-group of bits.

5. The LDPC decoder of claim 1, wherein the data portion comprises at least one of a systematic portion and a non-systematic portion.

6. A low-density parity check (LDPC) convolutional decoding method comprising:
   receiving a continuous encoded data stream;
   performing LDPC convolutional decoding of the continuous encoded data stream using a modified H-matrix and a constraint length value, the continuous encoded data stream including a plurality of successive, recurring data blocks using a plurality of associated parity check portions, the data blocks and their associated parity check portions comprising a modified H-matrix generated from the block code H-matrix: and for every continuous sub-stream bit defined by the modified H-matrix, outputting a plurality of bits depending on previous constraint lengths of the sub-stream data bits.

7. The method of claim 6, further comprising repeating the parity check portion for every Z-group of bits of the data portion, wherein the block code H-matrix comprises the data portion and a parity check portion separate from the data portion.

8. The method of claim 6, wherein the H-matrix is generated by concatenating a data portion of the block code H-matrix into the data blocks that are separated by a specified symbol interval and wherein the concatenating and the performing of the LDPC decoding are performed using at least one processor comprising a maximum likelihood (ML) processing element.

9. The method of claim 6, further comprising simultaneously performing the concatenating and the performing of the LDPC decoding using a plurality of Viterbi decoding processors.

10. The method of claim 6, wherein at least one of the data portion and the parity check portion comprises one or more bits that are punctured.

11. The method of claim 6, wherein the modified H-matrix comprises a code rate that conforms to the WiGig standard.

12. The method of claim 6, further comprising performing a traceback of the decoded bits of the data portion in parallel according to a specified z-group of bits.

13. The method of claim 6, wherein the data portion comprises at least one of a systematic portion and a non-systematic portion.

14. A low-density parity check (LDPC) convolutional encoder comprising:

an input configured to receive a continuous data stream; and at least one processing element configured to:

generate a modified H-matrix by:

separating a data portion of a block code H-matrix from a parity portion of the block code H-matrix, concatenating repeated data portions of the block code H-matrix to create continuous data portions of the block code H-matrix, and applying the parity check portion to a continuous sub-stream of the received data stream bits defined by the modified H-matrix; and perform LDPC convolutional encoding of the continuous data stream using the modified H-matrix and a constraint length value, and for every continuous sub-stream input bit defined by the modified H-matrix, output a plurality of bits depending on previous constraint lengths of the input sub-stream data bits.

15. The LDPC convolutional encoder of claim 14, wherein the at least one processor comprises a maximum likelihood (ML) processing element.

16. The LDPC convolutional encoder of claim 14, wherein the at least one processor comprises a plurality of Viterbi encoding processors.

17. The LDPC convolutional encoder of claim 14, wherein at least one of the data portion and the parity check portion comprises one or more bits that are punctured.

18. The LDPC encoder of claim 14, wherein the at least one processing element is configured to repeat the parity check portion for every k×Z-group of bits of the data portion.

19. The LDPC encoder of claim 14, wherein the modified H-matrix comprises a code rate that conforms to the WiGig standard.

20. The LDPC encoder of claim 14, wherein the data portion comprises at least one of a systematic portion and a non-systematic portion.

* * * * *